United States Patent [19]
Solie

[11] Patent Number: 5,831,492
[45] Date of Patent: Nov. 3, 1998

[54] WEIGHTED TAPERED SPUDT SAW DEVICE

[75] Inventor: Leland P. Solie, Apopka, Fla.

[73] Assignee: Sawtek Inc., Orlando, Fla.

[21] Appl. No.: 529,238

[22] Filed: Sep. 15, 1995

[51] Int. Cl.$^6$ .............................. H03H 9/145; H03H 9/64
[52] U.S. Cl. .......................... 333/193; 333/195; 333/196; 310/313 R; 310/313 B
[58] Field of Search ..................................... 333/193–196; 310/313 R, 313 B, 313 C, 313 D

[56] References Cited

U.S. PATENT DOCUMENTS

| | | | |
|---|---|---|---|
| 3,870,975 | 3/1975 | Vasile | 333/151 |
| 4,114,116 | 9/1978 | Reeder | 333/150 |
| 4,162,465 | 7/1979 | Hunsinger et al. | 333/151 |
| 4,203,082 | 5/1980 | Tsukamoto et al. | 333/194 |
| 4,316,161 | 2/1982 | Moore et al. | 333/141 |
| 4,321,696 | 3/1982 | Kanda | 367/157 |
| 4,331,840 | 5/1982 | Murphy et al. | 381/153 |
| 4,348,904 | 9/1982 | Bautista, Jr. | 73/644 |
| 4,449,107 | 5/1984 | Asai et al. | 333/150 |
| 4,480,209 | 10/1984 | Okamoto et al. | 310/313 B |
| 4,486,724 | 12/1984 | Schofield | 333/194 |
| 4,516,049 | 5/1985 | Mikoshiba et al. | 310/313 A |
| 4,600,905 | 7/1986 | Fredricksen | 333/196 |

(List continued on next page.)

FOREIGN PATENT DOCUMENTS

| | | | |
|---|---|---|---|
| 56-10724 | 2/1981 | Japan | 333/194 |
| 180316 | 9/1985 | Japan . | |
| 61-220509 | 9/1986 | Japan | 333/194 |
| 2206256 | 12/1988 | United Kingdom . | |

OTHER PUBLICATIONS

"Weighting Interdigital Surface Wave Transducers By Selective Withdrawal of Electrodes," C. S. Hartmann, Texas Instruments Inc., 1973 *Ultrasonics Symposium Proceedings*, pp. 423–426.

"Design Of Low–Loss Saw Filters Employing Distributed Acoustic Reflection Transducers," T. Komada, et al., Toshiba R/D Center, 1986 *Ultrasonics Symposium Proceedings*, pp. 59–64.

(List continued on next page.)

*Primary Examiner*—Robert J. Pascal
*Assistant Examiner*—Barbara Summons
*Attorney, Agent, or Firm*—Allen, Dyer, Doppelt, Milbrath & Gilchrist, P.A.

[57] ABSTRACT

Selected transducer geometries including unbalanced split electrode and three electrode per wavelength structures are employed for use in wide band tapered SAW devices. Combining geometries useful in narrow bandwidth SAW filters for canceling reflected waves leading to triple transit interference, and electrode tapering useful in wide bandwidth SAW filters for permitting transduction of a wide range of surface acoustic wavelengths has the unexpected result of significantly reducing insertion loss and improving triple transit suppression over wider bandwidths than can be achieved with SPUDT designs on non-tapered devices. The interdigitized electrode fingers of opposing bus bars in the transducer have a tapered alignment wherein a period of electrode finger portions along an acoustic wave propagation axis decreases along a transducer dimension. In one embodiment, the transducer has spacing between the electrode fingers which provides two pairs of unbalanced split electrodes within a spacing length equal to its respective acoustic wavelength. The positions and widths of the fingers are such that SPUDT transduction and reflection conditions are satisfied. In an alternate embodiment, the transducer has three electrodes per acoustic wavelength wherein the electrode widths and gaps between electrodes vary to satisfy the SPUDT transduction and reflection conditions. The performance of each transducer is further enhanced with subtransducers for providing series-block weighting. The three electrode per wavelength finger geometry further includes linewidth weighting for providing a fine weighting control to complement the inherently coarse weighting control of the series-block weighted transducer.

28 Claims, 7 Drawing Sheets

U.S. PATENT DOCUMENTS

| | | | |
|---|---|---|---|
| 4,602,228 | 7/1986 | Yamada | 333/194 |
| 4,625,184 | 11/1986 | Niitsuma et al. | 333/150 |
| 4,635,008 | 1/1987 | Solie | 333/195 |
| 4,672,592 | 6/1987 | Skinner | 367/159 |
| 4,746,882 | 5/1988 | Solie | 333/196 |
| 4,749,971 | 6/1988 | Solie | 333/153 |
| 4,767,198 | 8/1988 | Solie et al. | 359/305 |
| 4,908,542 | 3/1990 | Solie | 310/313 B |
| 4,973,875 | 11/1990 | Yatsuda | 333/195 X |
| 5,075,652 | 12/1991 | Sugai | 333/193 |
| 5,289,073 | 2/1994 | Mariani | 310/313 D |

OTHER PUBLICATIONS

"Capacitive Tap Weighted SAW Transducers," D.C. Malocha/B.J. Hunsinger, *IEEE Transactions on Sonics and Ultrasonics,* vol. SU–24, No. 5, Sep. 1977.

"Matching of Single–Phase Undirectional SAW Tranducers and a Demonstration Using a Low–Loss EWC/SPUDT Filter," B.P. Abbott/C.S. Hartmann/D.C. Malocha, University of Central Florida, 1990 *Ultrasonics Symposium Proceedings,* pp. 49–54.

"Wide Band Linear Phase SAW Filters Apodized Slanted Finger Transducers," P.M. Naraine/C.K. Campbell, Ontario, Canada, 1983 *Ultrasonics Symposium Proceedings,* pp. 113–116.

*Improved Design of Single–Phase Undirectional Tranducers for Low–Loss Saw Filters,* C.B. Saw and C.K. Campbell, Microwave Acoustics Laboratory, Dept. of Electrical and Computer Eng., McMaster Univ., Hamilton, Ont., Canada L8S 4L7–IEEE 1987 Ultrasonics Symposium Proceedings, pp. 169–172, Oct. 14–16, 1987.

*Surface Acoustic Wave Device* Supriyo Datta, Prentice Hall, Englewood Cliffs, NJ 07632. ©1986.

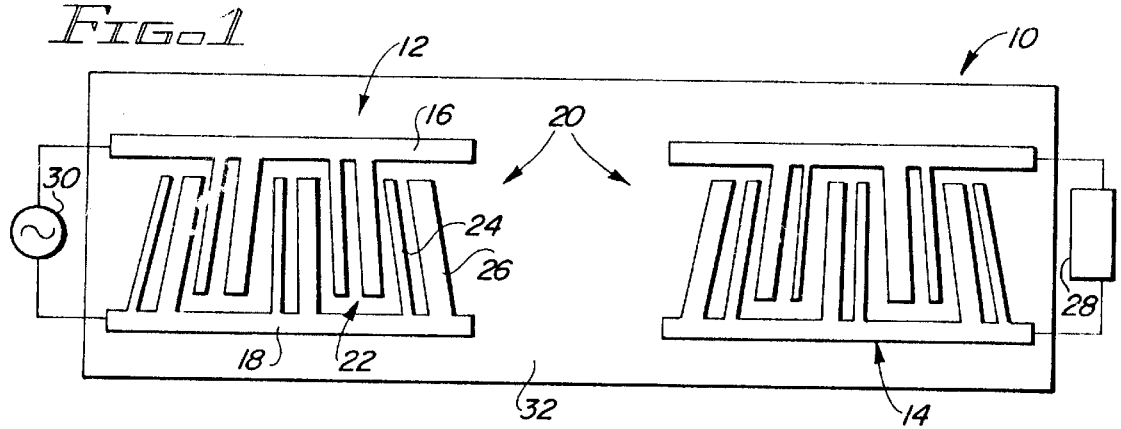
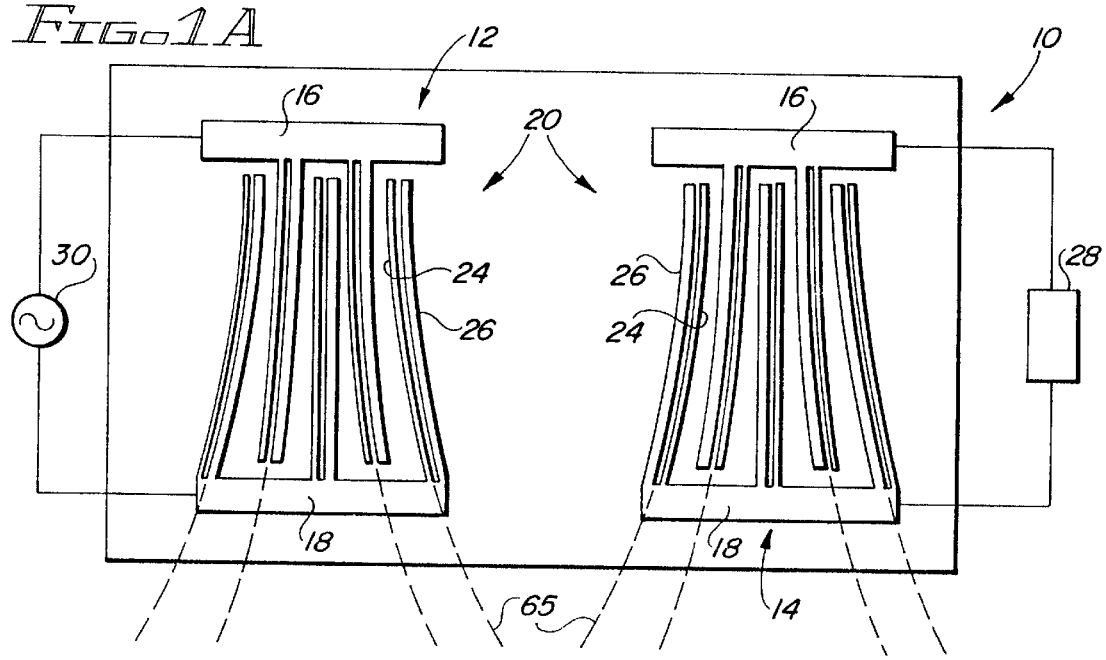
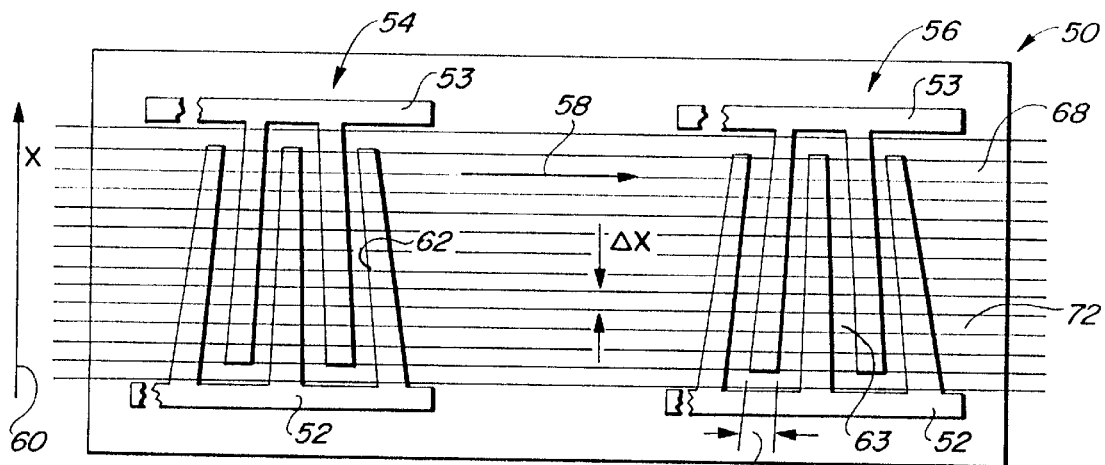

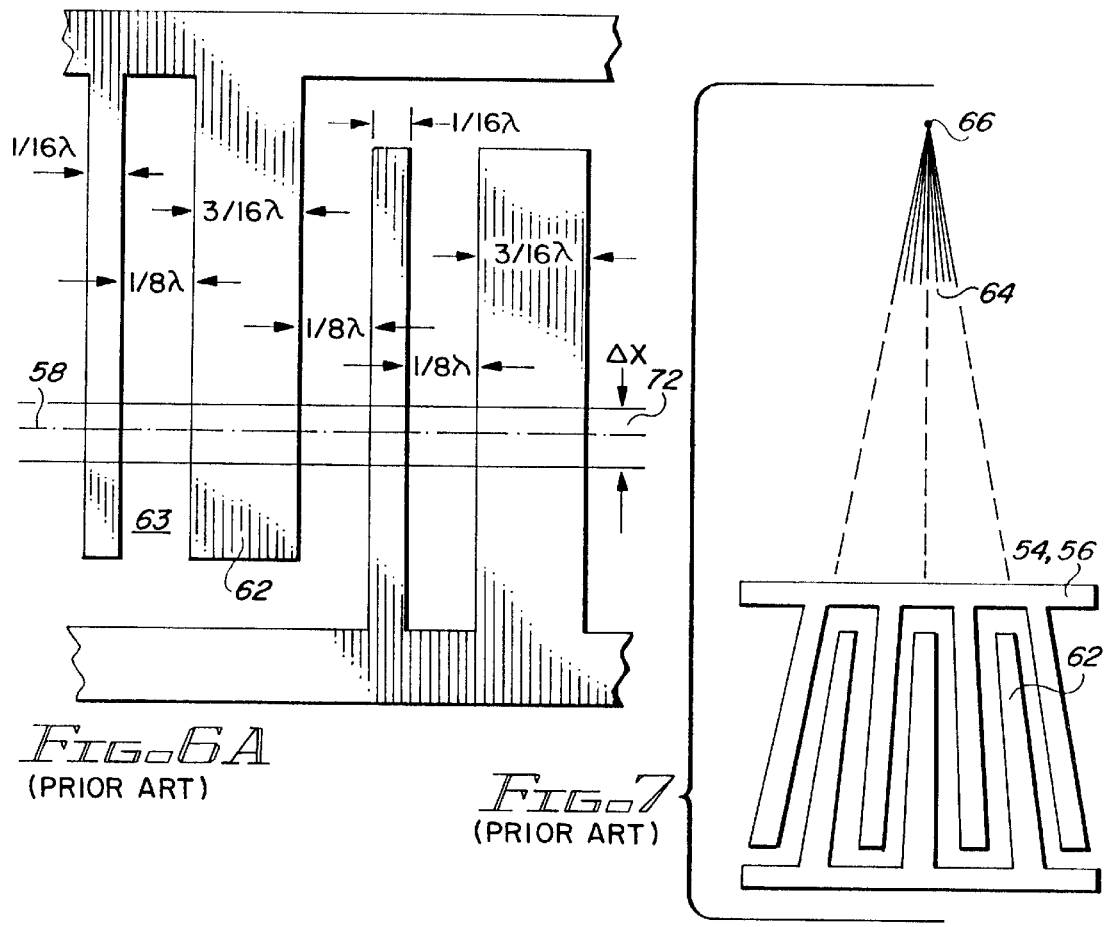
FIG. 6A (PRIOR ART)
FIG. 7 (PRIOR ART)
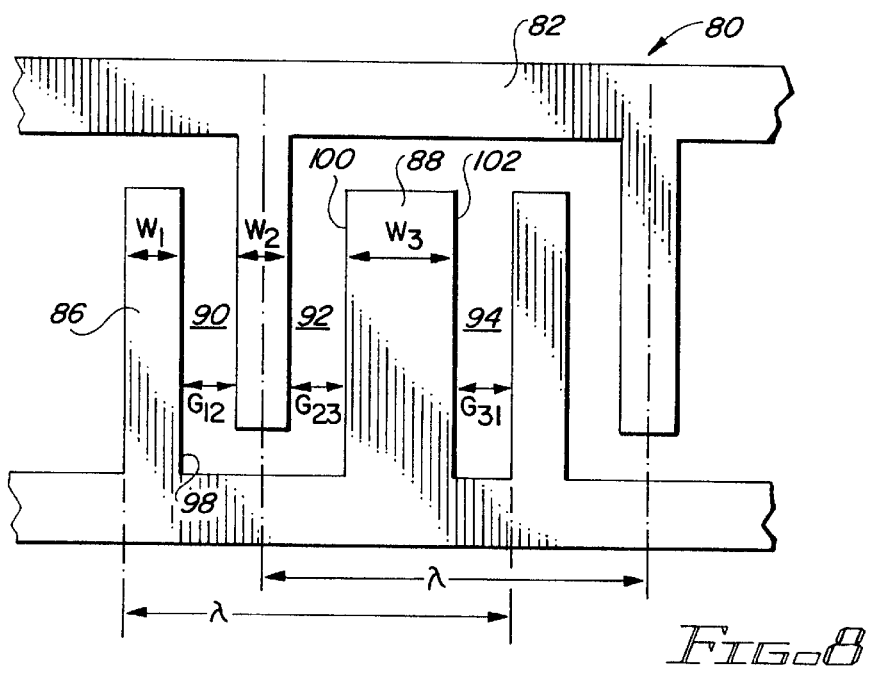
FIG. 8

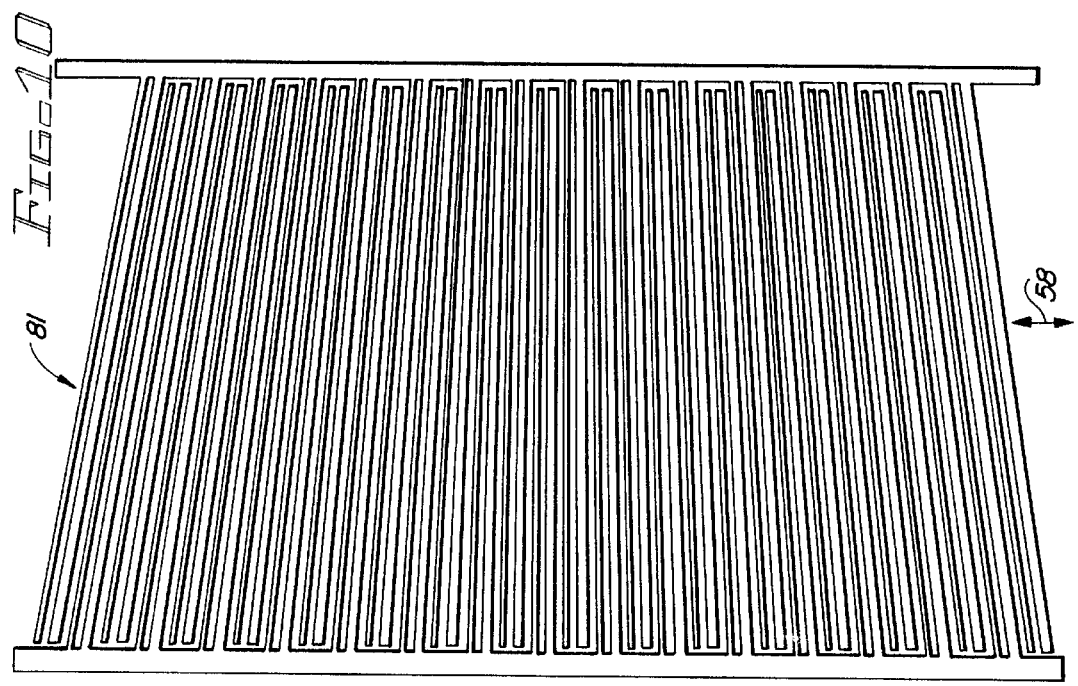
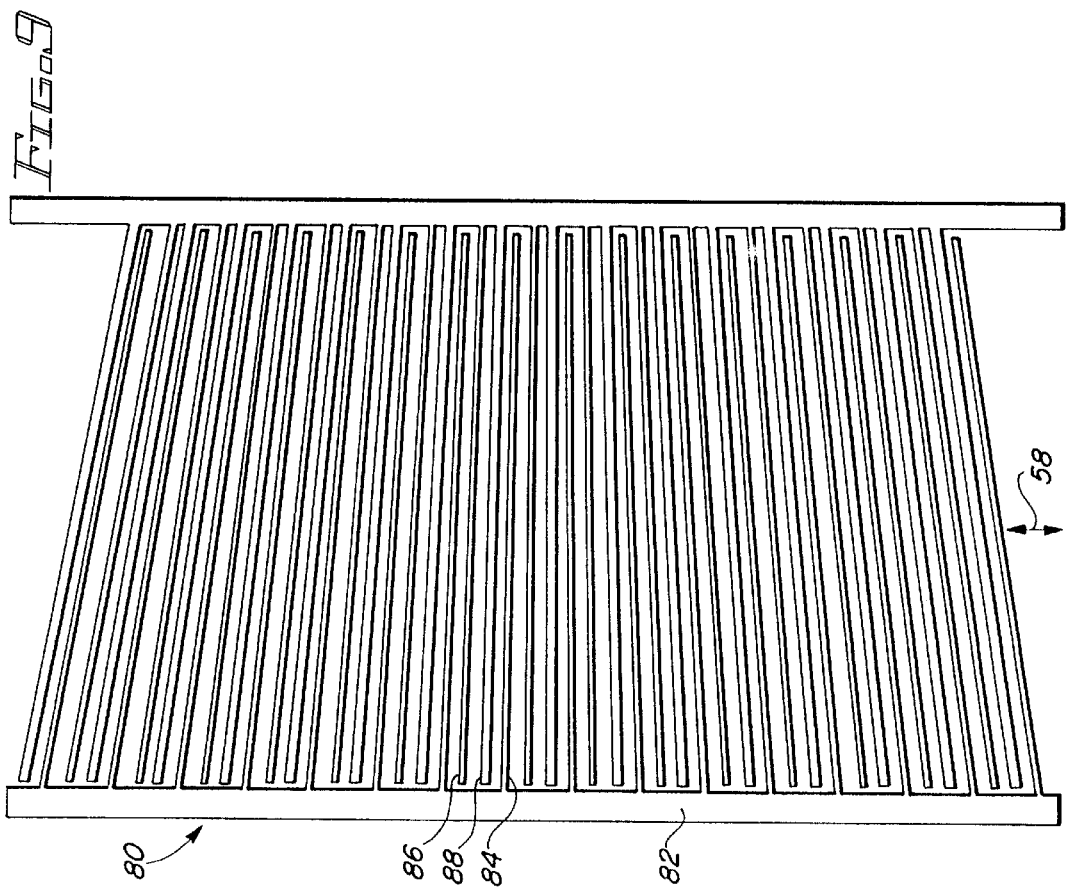

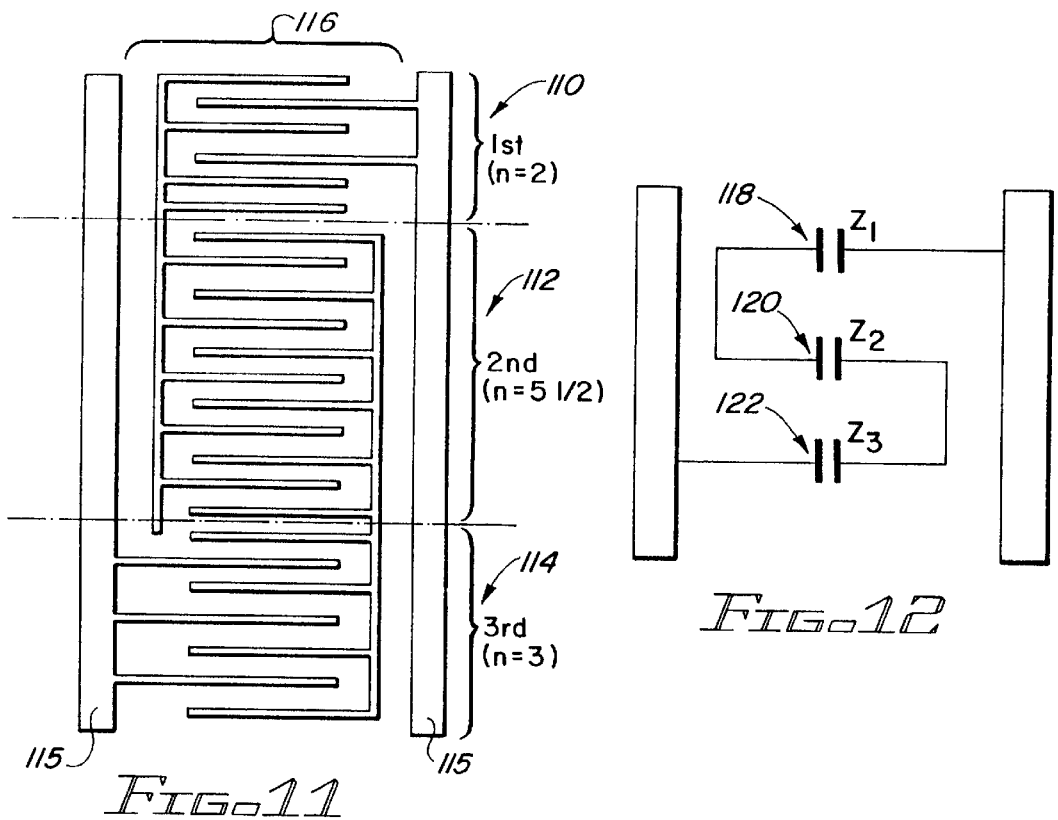
FIG-11
FIG-12
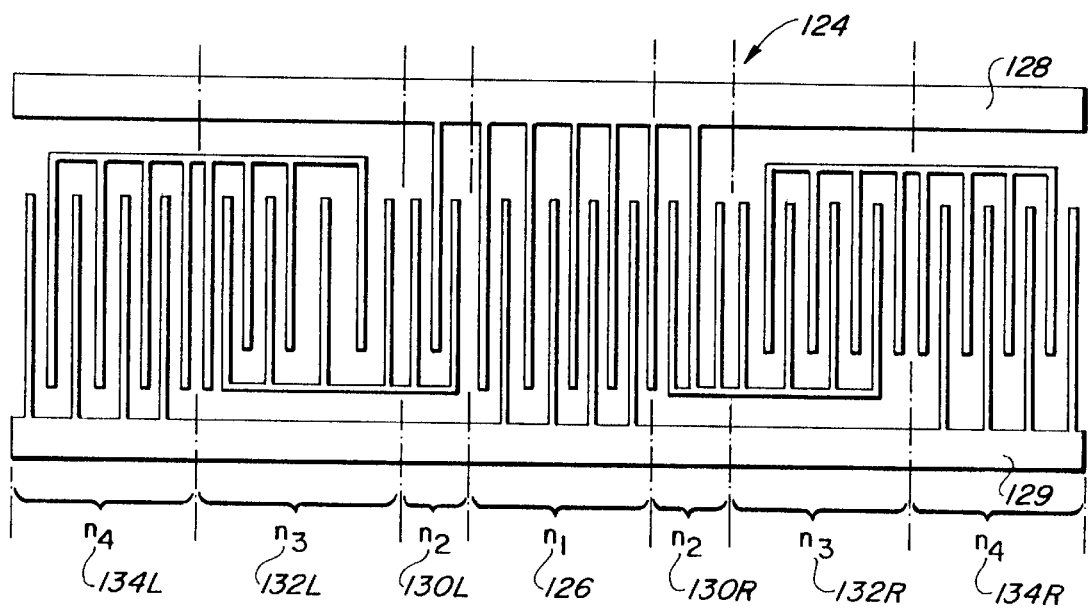
FIG-13

WEIGHTED TAPERED SPUDT SAW DEVICE

BACKGROUND OF INVENTION

1. Field of Invention

The invention relates generally to a surface acoustic wave filter and more particularly to a broadband unidirectional SAW device having a tapered transducer for achieving improved wide band triple transit suppression and reduced insertion loss.

2. Background Art

The use of surface acoustic wave (SAW) devices as filters or resonators is well known for having the advantages of high Q, low series resistance, small size and good frequency temperature stability when compared to other frequency control methods such as LC circuits, coaxial delay lines, or metal cavity resonators. As described in U.S. Pat. No. 4,600,905 to Fredricksen, typically, a SAW device contains a substrate of piezoelectric material such as quartz, lithium niobate, or zinc oxide. Input and output transducers are formed upon the substrate. The transducers convert input electrical signals to surface acoustic waves propagating upon the surface of the substrate and then reconvert the acoustic energy to an electric output signal. The input and output transducers are configured as interdigital electrode fingers which extend from pairs of transducer pads. Interdigital transducers may be formed by depositing and patterning a thin film of electrically conductive material upon the piezoelectric substrate.

Alternating electrical potential coupled to the input interdigital transducer induces mechanical stresses in the substrate. The resulting strains propagate away from the input transducer along the surface of the substrate in the form of surface acoustic waves. These propagating surface waves arrive at the output interdigital transducer where they are converted to electrical signals.

The basic tapered transducer has been reported in the literature and in particular in an article by P. M. Naraine and C. K. Campbell titled "Wideband Linear Phase SAW Filters Using Apodized Slanted Finger Transducers", for Proceedings of IEEE Ultrasonics Symposium, Oct. '83, pp 113–116. Naraine et al. discusses wide band linear phase SAW filters using apodized slanted or tapered finger transducers. In earlier publications, tapered finger transducer geometries have all the transducer fingers positioned along lines which emanate from a single focal point. A performance improvement was shown in U.S. Pat. Nos. 4,635,008 and 4,08,542 to Solie, the inventor of the present invention, by using hyperbolically tapered electrodes.

In Solie U.S. Pat. No. '008 a dispersive SAW filter comprises hyperbolically tapered input and output transducers which are aligned such that normals from the transducers to a dispersive reflective array are aligned at substantially the same angle. The dispersive reflective array includes a multiplicity of parallel conductive strips or grooves formed in the device substrate on which the transducer rests. Constant spacing between the transducer fingers causes a relatively narrow band of frequencies to be generated by the input transducer and received by the output transducer. In Solie U.S. Pat. No. '542, seeking a reduction in the resistive loss associated with the long narrow electrodes in wide acoustic aperture devices, a hyperbolically tapered transducer is provided with fingers having configuration paths which are subdivided into patterns that segment the acoustic beam width. Further disclosed is a means of transforming the impedance and thus reducing the insertion loss by a division of the SAW transducer structure into a plurality of subtransducers.

The use of tapered finger geometries on both input and output transducers permits the transduction of a wide range of surface acoustic wavelengths from input to output transducer, and thus provides an electrical filter with a wide frequency passband. Typically, high frequency components are transduced in the regions of the transducer where the finger-to-finger distance is the least. Low frequency components are transduced in the regions of the transducer where the finger-to-finger distance is the greatest. At any given frequency, a surface wave may be transmitted or received in a limited portion of the total acoustic aperture and the width of this active portion is called the "effective aperture" of the SAW beam.

The Naraine article states that for filters employing tapered finger transducer geometries, where the electrodes or fingers are straight line segments emanating from a single point, there is an inherent negative slope of the amplitude response with increasing frequency, as large as 5 dB for a 50% bandwidth case reported in the IEEE article. Naraine's article describes a method of flattening the amplitude response curve of a tapered finger filter by utilizing finger apodization. Apodization is a technique in which the length of individual transducer fingers is selectively adjusted so that the overlap between fingers of opposite polarities changes along the path traveled by the surface acoustic wave. The effect of the Naraine apodization technique is to achieve a flat passband by reducing the coupling of low frequency components, thus reducing the amplitude of the low frequency portion of the amplitude response curve. As addressed by Fredricksen U.S. Pat. No. '905, the overall performance of a tapered finger SAW filter would be enhanced if the amplitude of the high frequency portion of the response curve were increased rather than lowering the low frequency portion. The result would be an amplitude response curve with the desired flat plateau and a greater overall amplitude.

A SAW Single Phase Unidirectional Transducer (SPUDT) device comprises a SAW filter whose transducer electrode or finger geometries are such that the generated mechanical-electrical reflections tend to cancel out the regenerated surface waves of the SAW device. Single phase unidirectional transducers (SPUDT), also referred to as SPUDT transducers, have been used for decreasing triple transit ripple and insertion loss. By virtue of their construction, SPUDT based single SAW filters are inherently narrow-band devices with filter fractional bandwidths normally in the range less than 5%. Some have been designed for 10% bandwidth operation with some trade-off in insertion loss as described in an article by C. B. Saw and C. K. Campbell, titled "Improved Design of SPUDT For SAW Filters" in IEEE Proceedings at 1987 Ultrasonics Symposium, Denver Colo., November 1987.

U.S. Pat. No. 4,162,465 to Hunsinger et al, a SAW device with reflection suppression employs selected transducer geometries, such as unbalanced dual-finger geometries, to generate mechanical electrical loaded reflections (MEL) which tended to cancel reflected waves inherently generated by the electrical interaction between the transducer and the load. Each of the comb electrodes of the input and output transducers has a plurality of interdigitated electrode fingers. The width of at least some of the adjacent fingers and finger pairs of the electrodes are different and are selected as a function of the impedance of the load and/or the source to produce the mechanical electrical loaded reflections generated at the transducer in the substrate. As pointed out in the Hunsinger U.S. Pat. No. '465, an unfortunate limitation of conventional SAW transducers is the fact that when they are made to operate with relatively low losses, there is an inherent reflection emitted from the transducer referred to as a regeneration wave. This regeneration wave is a consequence of the extraction of acoustic surface wave energy and conversion of this energy to electrical signals. It can not be directly eliminated since it is inherent in the operation of the transducer. The reflection causes spurious signals which are detrimental to most signal processing operations of the SAW device. When a wave is reflected from a receiver transducer, it travels back toward the transducer from which it was originally transmitted and is again reflected from that transducer back toward the receiver transducer. The result is triple transit reflections due to the three traversals by the twice reflected signal, a highly undesirable result. Hunsinger U.S. Pat. No. '465 discloses a transducer having unbalanced dual finger geometries for creating the mechanical electrical reflections to cancel the unwanted inherent regeneration wave reflections.

It is well known terminology in the art and SAW literature to refer to an electrode structure having two electrodes or fingers per wavelength as "solid electrodes." In like manner, an electrode structure with four electrodes per wavelength, where a first and second electrode are connected and a third and fourth electrode are connected, is referred to as having "split electrodes" or a split electrode pair because each solid electrode has been split into two electrodes. With split electrodes, it is assumed that all electrodes have the same width. If one electrode of a split pair is wider than the other, the electrode configurations will be referred to herein as "unbalanced split electrodes". Split electrodes are bidirectional. Unbalanced split electrodes may be unidirectional (e.g. SPUDT) if the SPUDT reflective conditions are satisfied.

In considering the typical single phase unidirectional transducer, SPUDT techniques for decreasing triple-transit ripple and for decreasing insertion loss as described in Hunsinger U.S. Pat. No. '465, reflecting electrodes are interlaced with the transduction electrodes of a transducer so that within the transducer, both the transduction (generating or detecting a SAW) and reflection of the SAW are controlled both in amplitude and phase within each wavelength of the transducer. A transducer that can launch or detect a SAW will in general always reflect a portion of the wave due to the interaction of the SAW transducer with the electrical load. This reflection, which is load dependent, is called the regeneration reflection. There is an additional reflection from a transducer which is independent of the load and thus determined by the array of electrodes, which is called electrode reflection. This can be electrical in nature (due to the fact that electrodes will locally short the potential at the surface) and mechanical in nature (due to the mechanical discontinuities introduced by the finite dimensions (width and height), mass density and stiffness of electrode material). There may even be etched grooves integrated into the electrode structure which are included as part of the mechanical reflections. As described in Hunsinger U.S. Pat. No. '465, the operation of a SPUDT requires that the regeneration reflections be canceled in magnitude and phase by the mechanical reflections over the band width of operation of the transducer. It has been shown that for a conventional non-tapered transducer, this can be accomplished if the reflection-weighting function is equal to the auto-convolution of the impulse response of the transduction function, time compressed by a factor of one-half, at least in the weak to moderately high coupling case. In narrow bandwidth transducers (band widths of a few percent or less), the length of the transducer will be in the tens or hundreds of wavelength or more; and therefore, the desired reflection function (auto convolution of the transduction function) will be of comparable length (keeping in mind the length compression by one-half). This means that there will be tens of wavelengths of reflection within the transducer to achieve the desired magnitude of reflection.

For wider bandwidths of SPUDT, this process breaks down because the active length of the reflection (as defined by the compressed auto convolution function) becomes shorter so that the desired reflectivity per wavelength becomes unattainable. Reflectivities per electrode in the order of 1% or so are readily achievable, but at 5%–10% it becomes impossible or extremely impractical due to bulk mode scattering loss and fabrication processing constraints.

SUMMARY OF INVENTION

A tapered surface acoustic wave SPUDT transducer useful in providing an improved insertion loss and triple transit suppression signal for a wideband SAW filter comprises a pair of interdigitized opposing electrodes each having a plurality of interdigitized fingers. Within each acoustic wavelength the widths of the electrodes and/or the gaps between electrodes are not all equal. This is a consequence of satisfying the conventional SPUDT reflection requirements. The interdigitized electrode fingers of opposing electrodes in the transducer have a tapered alignment wherein a period of electrode finger portions along a longitudinal axis of acoustic wave propagation decreases along a transverse length of the fingers. Means are provided for applying an electrical load and/or source across the pair of electrode bus bars of each transducer.

In one embodiment, the transducer has spacing between the electrode fingers along an axis of surface acoustic wave propagation which provides two pairs of unbalanced split electrodes within a spacing length equal to a center frequency acoustic wave wavelength for a device having the transducer, herein referred to as a "four electrode per wavelength" transducer. In an alternate embodiment, the transducer has three electrodes per acoustic wavelength wherein the electrode widths and gaps between electrodes vary in such a manner so as to satisfy the SPUDT transduction and reflection conditions. This embodiment is herein referred to as a "three electrode per wavelength" transducer.

It is an object of the present invention to provide a transducer for use in wide band SAW devices which provides an improved performance over conventional wide band filters as measured by reduced insertion loss and enhanced triple transit suppression signal. It is another object of the present invention to provide a means for implementing coarse and fine weighting control of the transducer for which a weighting function for the transduction in a longitudinal direction (i.e. direction of SAW propagation) is substantially the same for any channel of the acoustic beam. It is yet another object to provide a simple method for controlling reflection strength for each wavelength so that both the reflection and the transduction can be specified independently within each wavelength of the transducer.

BRIEF DESCRIPTION OF DRAWINGS

A preferred embodiment of the invention as well as alternate embodiments are described by way of example with reference to the accompanying drawings in which:

FIG. 1 is a plan view of a surface acoustic wave device employing an embodiment of a tapered SPUDT transducer, wherein transducer fingers follow a generally linear pattern in accordance with the present invention;

FIG. 1A is a plan view of a surface acoustic wave device in an alternate embodiment of FIG. 1, wherein transducer fingers follow a generally hyperbolic curve pattern;

FIG. 6 is a partial plan view of a typical tapered transducer SAW device;

FIG. 6A is an enlarged plan view of a portion of a non-tapered SPUDT having a geometry useful in the tapered transducer of FIG. 6;

FIG. 7 is a partial plan view of a tapered transducer illustrating tapered finger elements, by way of example, following radial lines emanating from a common focal point;

FIG. 8 is a partial plan view of a non-tapered transducer of an alternate SPUDT embodiment of the present invention illustrating a three electrode per wavelength geometry;

FIG. 9 is a plan view of a transducer illustrating a tapered three electrode per wavelength transducer geometry of an embodiment of the present invention; and FIG. 10 is a plan view of a transducer illustrating a tapered unbalanced split electrode geometry of an alternate embodiment of the present invention.

FIG. 11 is a partial plan view of a transducer of the present invention illustrating a subtransducer structure for series-block weighting a transducer;

FIG. 12 is a schematic diagram illustrating an equivalent electrical circuit for the subtransducer geometry of FIG. 11;

FIG. 13 is a partial plan view of a transducer having subtransducers implemented to provide series-block weighting in combination with live width weighting;

DETAIL DESCRIPTION OF PREFERRED EMBODIMENT

Figures 2, 3:
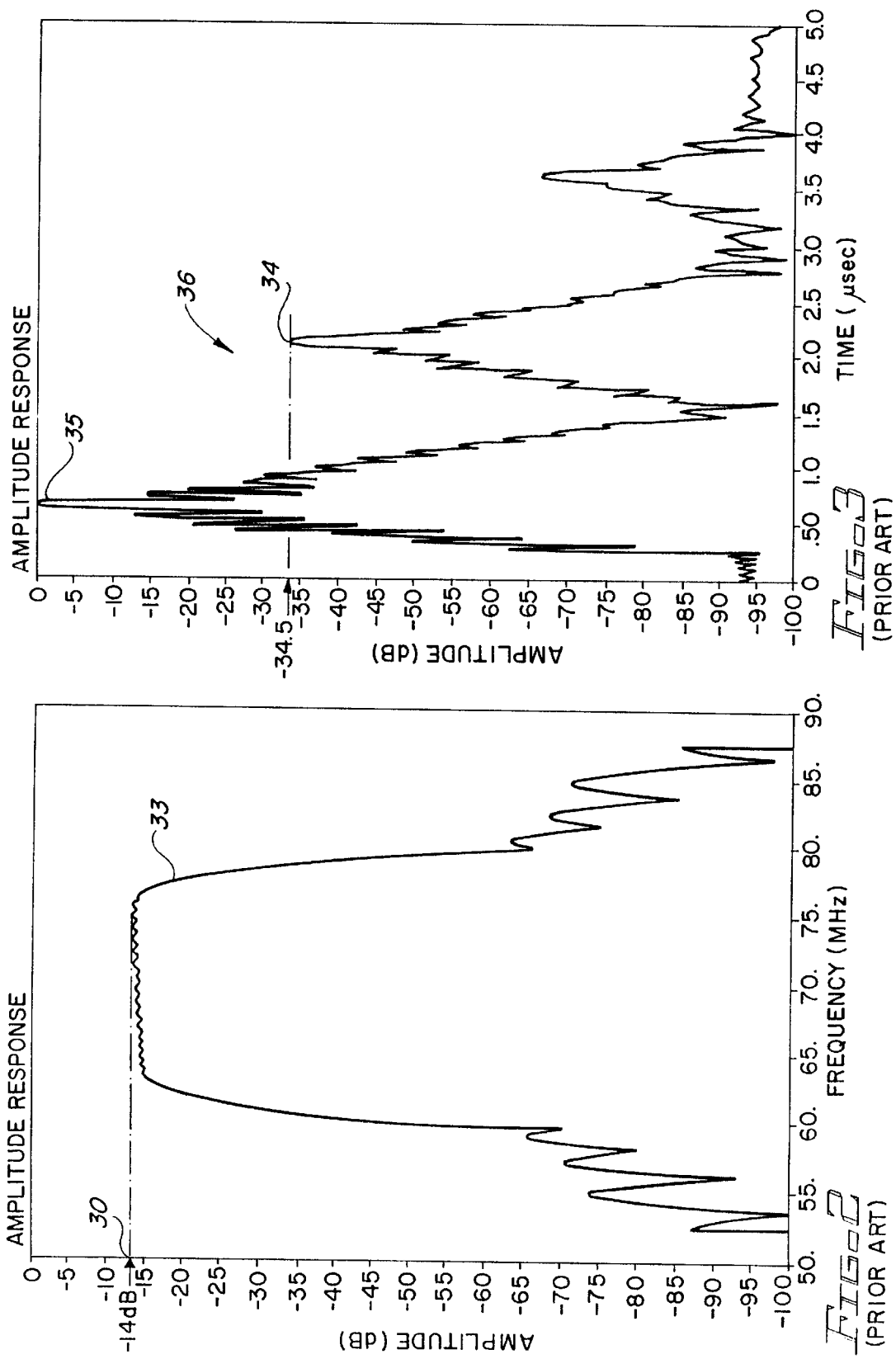
FIG. 2 is a frequency response for a conventional non-tapered SAW SPUDT filter having a 3 dB bandwidth of approximately 14.5 MHZ.
FIG. 3 is a time response for the conventional filter of FIG. 2.
Figure 4:
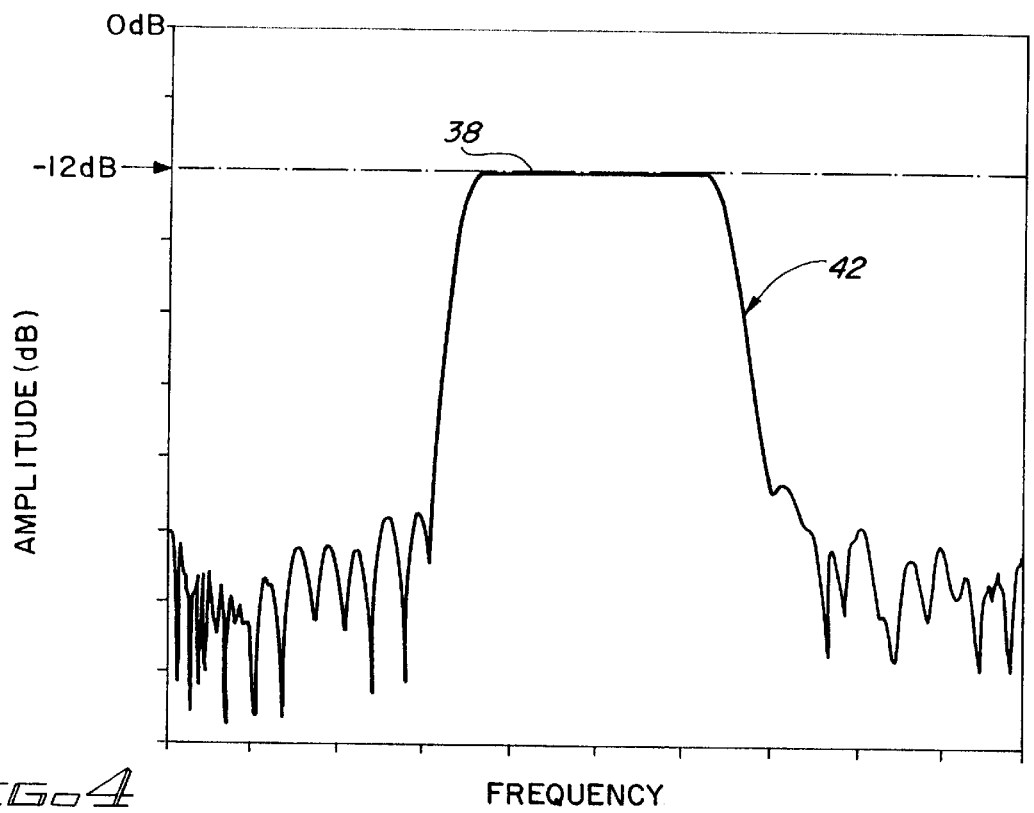
FIG. 4 is a frequency response for a tapered SPUDT SAW device of the present invention having a bandwidth and center frequency similar to the conventional device having the responses of FIGS. 2 and 3.
Figure 5:
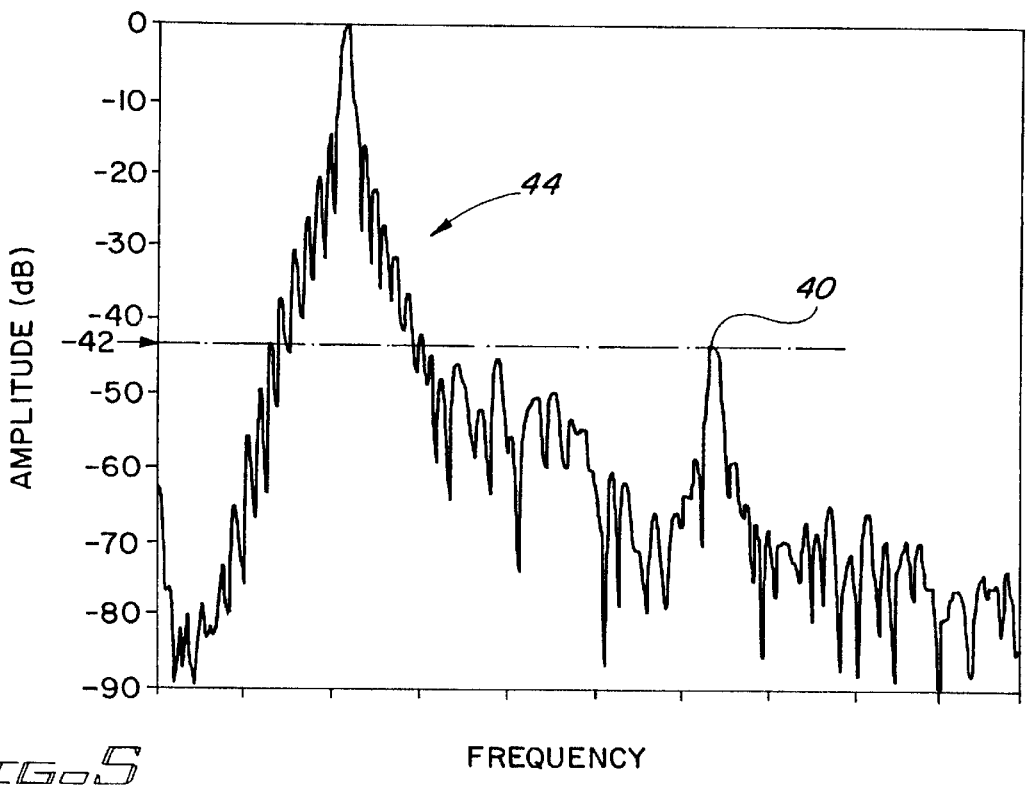
FIG. 5 is a time response for the tapered SPUDT SAW device of FIG. 4.

A preferred embodiment of the present invention, a tapered SPUDT SAW filter device 10 is illustrated with reference to FIGS. 1 and 1A. The device 10 comprises input and output transducers 12, 14 with opposing bus bars 16, 18 each having a plurality of interdigitized, continuously tapered electrode fingers 20 configured in finger pairs 22 with each pair 22 having a finger of narrow width 24 adjacent to a finger with a larger or wider width 26, by way of example in the embodiment illustrated. The finger widths 24, 26 are selected as a function of the impedance of a load 28 or source 30 so as to produce mechanical electrical loaded reflections in a substrate 32 upon which the transducers 12, 14 are placed.

Providing an unbalanced split electrode or finger geometry is known in narrow bandwidth SAW filters to successfully cancel reflected waves inherently generated by SAW devices. Such reflected waves lead to triple transit interference. Tapering the electrode fingers in wide bandwidth SAW devices is known to permit the transduction of a wide range of surface acoustic wavelengths. The combination as described herein has the unexpected result of significantly reducing insertion loss and enhancing triple transit suppression, both very much desirable in wide bandwidth SAW filter devices.

By way of example, and with reference to the frequency and time response curves of FIGS. 2–5, a comparison between a conventional non-tapered 70 MHZ SPUDT filter with a 3 dB bandwidth of approximately 14.5 MHZ and a tapered SPUDT of the present invention having similar bandwidth and center frequency is made. As illustrated with reference to FIG. 2, an insertion loss 31 of the conventional filter is estimated at approximately 14 dB as measured from an amplitude frequency response 33. The triple transit spurious signal 34 is suppressed approximately 34 dB below the main signal 35 as illustrated with reference to FIG. 3 for an amplitude time response 36. The tapered SPUDT filter with similar bandwidth and center frequency exhibits an insertion loss 38 of about 12 dB and a triple transit suppression signal 40 greater than 42 dB as illustrated in the amplitude frequency response 42 and amplitude time response 44 respectively in FIGS. 4 and 5. A 2 dB improvement in the insertion loss (38 v. 31) along with greater than 8 dB improvement in the triple transit signal (40 v. 34) clearly demonstrates superior performance of the tapered SPUDT filter of the present invention over that of the conventional SPUDT filter.

To further detail the features of the present invention, consider a typical tapered transducer SAW filter device 50 illustrated with reference to FIG. 6. Tapered transducers are typically used in pairs, input transducer 54 and output transducer 56 in linear phase filter applications, each transducer having opposing bus bars 52, 53. Surface wave propagation, again with reference to FIG. 6, is from left to right as shown by the arrow 58. The transverse dimension 60 is here defined as the X direction, and it can be seen that the period of the electrodes or fingers 62 (which defines the wavelength) becomes smaller as X increases. Consequently, the frequency increases with X. As illustrated with reference to FIG. 7, and as described earlier with reference to Fredricksen U.S. Pat. No. '905, transducer tapered fingers 62 in one embodiment have the fingers 62 tapered along lines 64 which emanate from a single focal point 66 as is the embodiment of FIG. 1. In an alternate embodiment, the tapered fingers 20 follow hyperbolically curved lines 46, as illustrated with reference to FIG. 1A. The high frequencies are detected in the upper portion 68 (see FIG. 6) of the saw aperture, and the lower frequencies in the lower portion 70 of the SAW aperture. As illustrated by way of example in FIG. 6, there are two electrodes per wavelength which, as earlier described, are typically solid electrodes. A variety of electrode structures may be used. A major constraint imposed on this structure is that, except for taper, every horizontal spacial interval or channel 72 of the transducers 54, 56 should be essentially the same as all other channels 72. In other words, all frequencies within the range of the device, though shifted up or down as the transducer 54 operates, will be excited (or detected) by the same electrode structure.

In the device 50 illustrated with reference, apodization is not appropriate as a means of tap weighting. Other researchers have chosen to use apodization, with the result that the time response at different frequencies within the pass band is not the same.

For modeling purposes, and for filter synthesis purposes, we have chosen to impose the constraint that all channels 72 horizontal through a transducer must be the same except for a scale factor which results from the taper. Each horizontal slice or channel 72 as illustrated in FIG. 6 has a width $\Delta X$ which is sufficiently narrow so that the taper can be ignored. By way of example, and as illustrated with reference to FIG. 6A, the spacing 63 between fingers 62 and the width 65 of the fingers 62 are dimensioned as fractional portions of a center frequency wavelength $\lambda$ as described in the Hunsinger U.S. Pat. No. '465 along any $\Delta X$. In the analysis of the present invention, the taper can be ignored for that $\Delta X$ or channel 72. As described in U.S. Pat. No. 5,075,652 to Sugai, when the tapered electrode fingers 62 are divided into several channels parallel to the propagation direction 58, they can be considered as normal (i.e., non-tapered) type fingers. Thus the frequency response from the narrow channel 72 is that of a pair of unweighted transducers with 13 dB side lobes each, or 26 dB for the pair if they are identical. The response of any other channel 72 of width $\Delta X$ is the same but shifted up or down in frequency, depending upon its position in X along the transverse dimension 60. The response of the entire filter 50 is the summation of all slices 72 that make up the aperture transverse dimension 60.

In the frequency domain, the response of a single channel is smeared over the frequency range from the lowest to the highest frequencies in the tapered electrodes. This produces a generally flat bandpass. If it is not sufficiently flat, it can be easily corrected to become flat by varying the rate of taper in the X direction. That can be understood by noting that, at any frequency ($F^i$), if the rate of taper (the slope of the lines 64, see FIG. 7) is reduced, with the result that the effective aperture at frequency $F^i$ is wider; then the signal strength at $F^i$ is increased. Therefore, by selectively controlling the rate of taper in the transducer 54, one can control the pass-band shape. In other words, one can vary the pass-band shape, adding a dip or hump or any desired pass-band amplitude compensation that is relatively slowly varying. The side lobes in the total response also result from smearing the side lobes of the narrow channel 72 or $\Delta X$. By way of example, if the side lobes of a narrow channel are 26 dB, the resulting tapered filter will have side lobes which are of the order of 26 dB.

The present invention combines SPUDT technology of narrow bandpass devices as earlier described with that of tapered wide band transducer technology. The problems associated with SAW devices requiring the use of wide bandwidths is resolved by the present invention which comprises SPUDT transducer geometries having tapered electrodes. At each frequency, the active portion of the transducer may be tens or hundreds of wavelengths long. Therefore, there is sufficient length in which to integrate the reflecting electrode structures with the transduction process and achieve the desired or necessary reflectivity. The bandwidth is achieved by tapering the electrodes over the desired frequency range. For a single channel 72 of the tapered filter 10 (see FIG. 1), the bandwidth is generally a few percent or less and the time impulse response generally has a simple response, like Hamming, in which there are no time phase side lobes. The auto convolution of this simple response is easy to implement within a narrow channel of the tapered transducer, and likewise for all other channels as it is continuously tapered. The time impulse response of the complete tapered transducer will be quite different as earlier described with reference to FIGS. 2–5. It will have many time side lobes (the actual number depends upon the filter shape factor). The main lobe which accounts for most of the energy is only a fraction of the length of a single narrow channel. Since the reflection is canceled on a slice-by-slice, channel-by-channel or frequency-by-frequency basis, there is no need in a tapered transducer to confine the length of the reflectivity to such a narrow time response. Thus, the SPUDT conditions, typically limited to narrow bandwidth conditions, can be met over any relative bandwidth with easily achievable reflectivities per tap.

In addition to varying finger or electrode dimensions and combinations as described in the Hunsinger U.S. Pat. No. '465 and in the tapered SPUDT of the embodiment herein described, controlled tap weight strength and reflection strength is implemented on a tap by tap and finger-by-finger basis. In an alternate embodiment of the present invention, the tap weight strength and reflection strength are controlled as illustrated, by way of example, with reference to FIG. 8 comprising a three-electrode per wavelength structure 80. The upper bus bar 82 is assumed to be hot in the following discussion and comprises an electrode or finger 84 having a width $w_2$. Fingers 86, 88 adjacent finger 84 are grounded and respectively are of width $w_1$ and $w_3$. The gaps 90, 92, 94 following each electrode or finger 86, 84, 88 are $g_{12}$, $g_{23}$, and $g_{31}$. If $w_2=w_1=g_{12}=\lambda/8$ and $w_3=\lambda/4$ and $g_{23}=g_{31}=3/16$ $\lambda$, we have the structure disclosed by C. S. Hartmann et al. in 1989 IEEE Ultrasonics Symposium, titled "Overview of Design Challenges For Single Phase Unidirectional SAW Filters" and discussed in 1990 IEEE Ultrasonics Symposium paper titled "Matching of Single Phase Unidirectional SAW Transducers and a Demonstration Using Low Loss EWC/SPUDT Filter," and known as the Electrode Width Compensation (EWC) SPUDT. The reflectivity and transduction strength of the structure 80 is to be varied. By way of example, the EWC has a fixed tap weight strength and a fixed relative reflectivity of 2.0 (where the reflectivity from a single edge of an electrode is 1.0). The generalized three electrode or fingers 84, 86, 88 per wavelength structure 80 shall be called 3E/$\lambda$ in these discussions. The transduction strength T is determined coarsely by setting the center finger 84 width $w_2$. The approximate tap weight is then given by:

$$T=1-(1-\sin 2\pi\, w_2/\lambda)\, C$$

where $C \approx \frac{1}{2}$. When $w_2/\lambda=\frac{1}{4}$, $T \approx 1$ and as $w_2/\lambda$ decreases to $\frac{1}{16}$, $T=0.69$. The remaining two-electrodes 86, 88 or more precisely, four-electrode edge positions 96, 98, 100, 102 are varied to define a specified or use specific (required) reflectivity. The phase of the reflection of a tap is referenced to the center of transduction, or roughly to the center of the center electrode or second finger 84. Typically, the phase of the center finger 84 or second electrode is not changed, once selected, because its location or specifically width $w_2$ is specified by the transduction requirement. The combined reflection from all three electrodes or fingers 84, 86, 88 must satisfy the conditions that the component of the reflectivity in phase with the regeneration (centered roughly at electrode #2 84) must be of opposite sign or polarity as the regeneration reflection, and the component of the reflectivity in phase quadrature to the regeneration must be zero. The desired magnitude is specified by the filter design. These two conditions, plus the condition that no electrode or finger width or gap shall be smaller than some specified limit, are used to determine the edge of electrodes #1 86 and #3 88, illustrated again with reference to FIG. 8. If necessary for a more accurate tap weight control, the actual transduction strength of the tap can be calculated knowing the locations of the nearest neighbors 86, 88 of electrode #2 84. The width $w_2$ of electrode #2 84 can be increased or decreased to set the tap weight more precisely, and the corresponding reflectivity can be realized more precisely by adjusting the edge positions 96, 98, 100, 102 of the other two electrodes 86, 88. This is an iterative process that converges very rapidly, and, in fact, for some applications one iteration is sufficient. The result is that for the 3E/λ structure 80, one can independently specify the transduction strength T and the reflectivity R for each tap.

In an alternate embodiment of a tapered transducer, the 3E/λ structure 80, including line-width weighting, is incorporated as illustrated with reference to FIG. 9 illustrating a transducer pattern which is replicated in a thin conductive film on the SAW device substrate. As illustrated with reference to FIG. 10, a tapered SPUDT following the earlier described unbalanced split electrode geometry 81 is presented.

The frequency sidelobes of the narrow channels determine the sidelobes in the tapered filter. What is needed is a method of weighting the taps, which is the same for all channels. In other words, weighting the electrodes within a given wavelength along the SAW path. Apodization does not meet the criteria. One technique which has been suggested in the prior art is withdrawal weighting. This will work and is an improvement over no weighting, but it is rather coarse and produces frequency sidelobes which increase in magnitude farther from the mainlobe. As a result, the selectivity will deteriorate for moderately to wideband filters as the mainlobe is smeared out to these increasing sidelobes.

There are three types of weighting that are used individually and in combination to provide improved frequency selectivity. They are series-block weighting, line-width weighting, and capacitive weighting. Series-block weighting and line-width weighting are herein described for preferred alternate embodiments of the present invention.

Series subtransducers are described in the earlier references to Solie U.S. Pat. No. '008 and Solie U.S. Pat. No. '542 as a means of transforming the impedance of tapered transducers using strings of series connected transducers (called subtransducers). Each subtransducer had the same number of electrodes, so the voltage is divided equally between the subtransducers, and the voltage at every tap is the same. Therefore, there is no tap weighting. The distinguishing feature of the present invention, as illustrated with reference to FIG. 11, using, by way of example, a non-tapered transducer, is that the number of taps or wavelengths in each subtransducer is varied so that the voltage applied to a string of transducers is divided in such a manner as to weight the taps with respect to each other. The relative tap weight is proportional to the relative voltage applied to the tap. With reference to FIG. 11, first note that the three subtranducers 110, 112, 114 are acoustically cascaded (share the same acoustic track or device aperture 116) and are electrically in series. If the impedance is dominated by capacitance, which is generally the case, the impedance of each subtransducer is inversely proportional to the number of the taps within that subtransducer. An equivalent circuit of this string of subtransducers 110, 112, 114 is illustrated with reference to FIG. 12, where capacitors 118, 120, 122, respectively, have values $z_1$, $z_2$ and $z_3$. Again with reference to FIG. 11, it can be seen that there are two taps in the first subtransducer 110, five and one-half in the second 112, and three in the third 114 An index "n" is the number of taps or wavelengths. There are two gaps per wavelength. If two adjacent fingers or electrodes are connected to the same bus bar, there is no voltage across that gap. Therefore, it is not counted as a gap for the purpose of counting taps per subtransducer. It follows, therefore that $z_1=z_0/2$, $z_2=z_0/5.5$ and $z_3=z_0/3$, where $z_0$ is a tap impedance specified over one wavelength. The outer bus bars 115 are called major bus bars. By way of example, if we define the voltage or tap weight across the major bus bars 115 as 1.0, then the tap weights in the three subtransducers 110, 112, 114 are:

$$t_1 = \frac{1/2}{1/2 + 1/5.5 + 1/3} = .508$$

$$t_2 = \frac{1/5.5}{1/2 + 1/5.5 + 1/3} = .185$$

$$t_3 = \frac{1/3}{1/2 + 1/5.5 + 1/3} = .338$$

Assuming all the tap electrodes or fingers are identical, the taps within a subtransducer all have the same weight and are a block of taps of the same strength. For a preferred embodiment, there are be several strings in a transducer and usually they are constructed symmetrically about the center of a transducer. A string may consist of one subtransducer, in which case there is no voltage division and all taps in this string have a tap weight of unity.

An advantage of block weighting is the uniformity of weighting across the SAW aperture and that it can be achieved with a single layer metalization. The disadvantages are that the taps cannot be individually weighted, and the possible tap weight values are somewhat limited (i) by the fact that the sum of the voltages across the subtransducers must be one, and (ii) by the constraints of setting the impedances by the number of taps. Nonetheless, block weighting provides a useful technique for use in the present invention.

A second technique used to weight the taps includes varying the width of the electrodes, as earlier described. This is referred to as line-width weighting. Within a line-width frequency range, as the electrode or finger width 84, $w_2$ (refer to FIG. 8) (in the direction of SAW propagation) is increased, the tap weight or transduction strength of the tap is increased. This is valid for the range where w/λ (finger width to wavelength) is ≦0.4, and for most practical examples where w/λ≦0.25. The lower range of w/λ is limited by the line width that can be fabricated both on the device and on the mask. For lower frequency devices, this range of w/λ can be large enough to change the relative tap weight strength from 1.0 down to around 0.5, whereas at higher frequencies the frequency range will be much more limited. In general, it can be said that the range can not significantly approach zero and can only decrease somewhat from unity (relative tap weight). This line-width weighting, however, is useful when combined with series-block weighting. Unlike line-width weighting techniques used in the past, limited because of limited tap weight range, when combined with series-block weighting, the achievable tap weight range is much broader.

Figure 14:
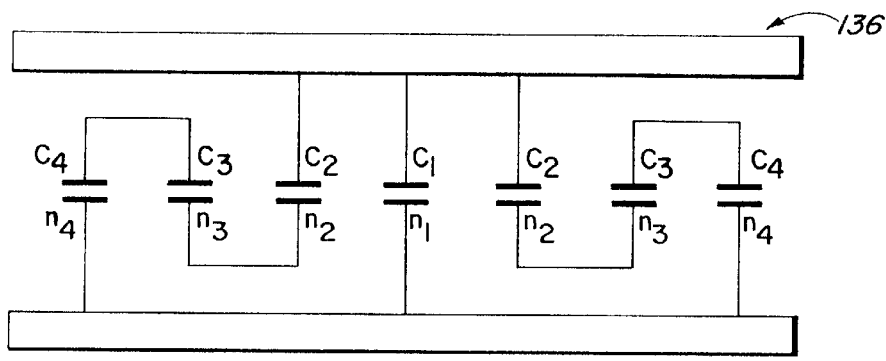
FIG. 14 is a schematic diagram illustrating an equivalent electrical circuit for the transducer structure of FIG. 13.

By way of example and with reference to FIG. 13, the line-width weighting of a 3E/λ structure 124 is used with series-block weighting to implement a Hamming weighted function (which is a common weighting function for each channel of a tapered transducer). Again with reference to FIG. 13, consider the transducer 124 (non-tapered for simplicity in the illustration herein) consisting of a set of taps ($n_1$) or main subtransducer 126 in the center that are directly connected to the primary (hot and ground) bus bars 128, 129 and a string of three subtransducers connected in a series symmetrically on each side 130L, 132L, 134L, 130R, 132R, 134R of the main subtransducer 126. Electrically the circuit 136 of the subtransducers (representing a transducer by a capacitor) is as shown in FIG. 14. The three subtransducers (130L–134R) in series on each side of the center subtransducer 126 will divide the voltage between them by normal voltage division. If the number of electrodes or fingers in the subtransducer is $n_1$, $n_2$, $n_3$ and $n_4$, as illustrated with reference to FIG. 13, the relative voltage across the center substransducer is 1.0 (full strength), and on #2 is:

$$a_2 = \frac{1/n_2}{1/n_2 + 1/n_3 + 1/n_4}$$

and on transducers #3 and #4 is $$a_3 = \frac{1/n_3}{1/n_2 + 1/n_3 + 1/n_4}$$

$$a_4 = \frac{1/n_4}{1/n_2 + 1/n_3 + 1/n_4}$$

Figure 15:
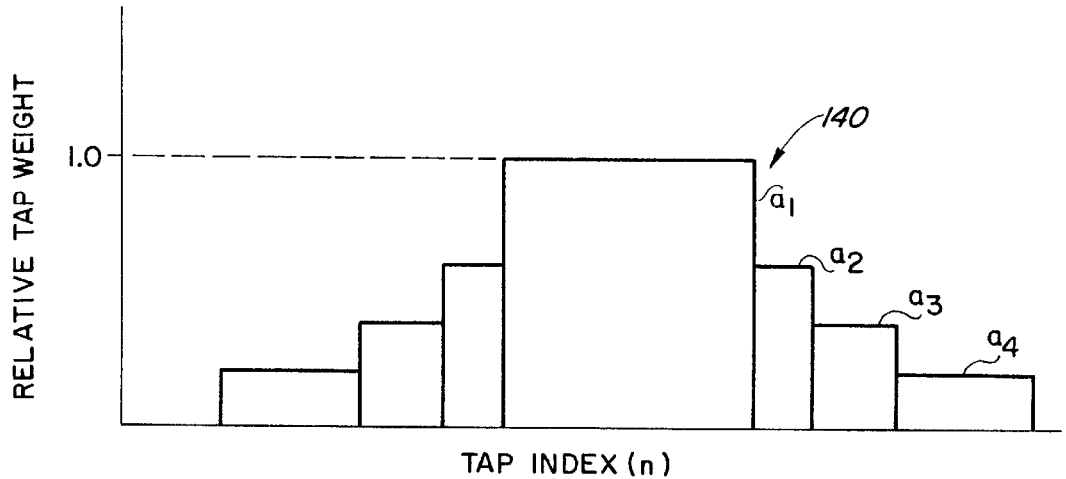
FIG. 15 is a plot illustrating a tap weight function approximation to a Hamming function.
Figure 16:
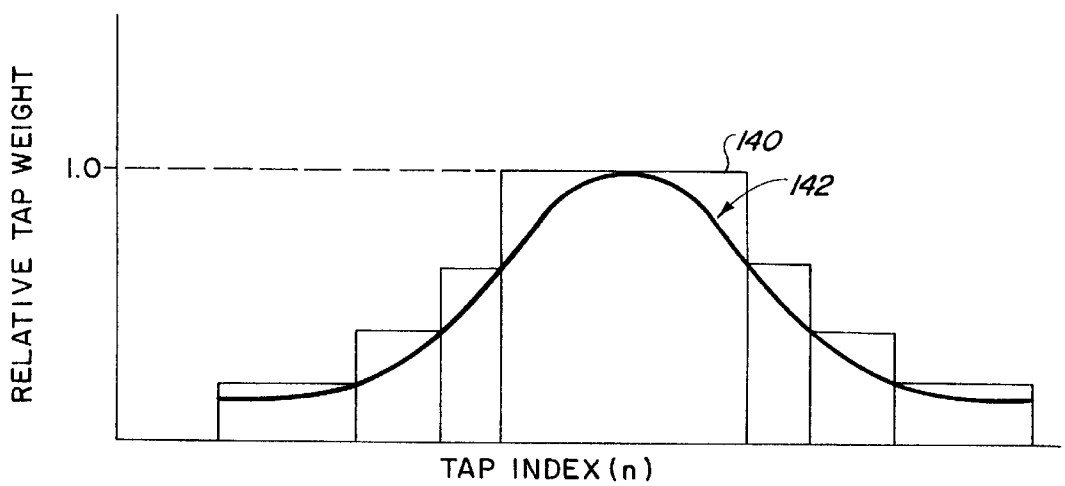
FIG. 16 is a plot illustrating a weighting function resulting from the combination of series-block weighting and line-width weighting.

A plot 140 of the tap weight that can be realized by block weighting is illustrated with reference to FIG. 15. This is an approximation to a Hamming function. Using line-width weighting as herein described, we can reduce the tap weight of each tap within a block or subtransducer by a factor of $m_1$ where $1 \geq m_1 \geq 0.7$ (the value of 0.7 is by way of example only). As a result, the combined series-block weighting and line-width weighting combination 142 is as illustrated with reference to FIG. 16.

As can be seen, combined series-block and line-width weighting 142 provides an improved approximation to a desired tap weight function. As a result, frequency sidelobes will be correspondingly lower. The frequency response of the tapered transducer is derived from this non-tapered (narrow channel) response by "sliding" the non-tapered response over frequency channel by channel, as earlier described. A consequence of this process is that the better the selectivity of the narrow channel region, the better the selectivity of the tapered transducer.

In a preferred embodiment of the present invention, a tapered SPUDT transducer is configured with four electrodes per wavelength, as illustrated with reference to FIGS. 1 and 1A, and improved further with series-block weighting, as illustrated with reference to FIG. 13. An alternate embodiment describes a tapered three electrode per wavelength geometry, as illustrated with reference to FIG. 8, which in turn is coarsely weighted using series-block weighting techniques as herein described and finely weighted using line-width weighting techniques in combination with the block weighting.

While specific embodiments of the invention have been described in detail herein above, it is to be understood that various modifications may be made from the specific details described herein without departing from the spirit and scope of the invention as set forth in the appended claims.

Having now described the invention, the construction, the operation and use of preferred embodiments thereof, and the advantageous new and useful results obtained thereby, the new and useful constructions, methods of use and reasonable mechanical equivalents thereof obvious to those skilled in the art, are set forth in the appended claims.

What is claimed is:

1. A transducer for a surface acoustic wave device which includes an acoustic wave propagating substrate upon which the transducer is adapted, the transducer comprising:

a pair of opposing bus bars formed on a substrate, each bus bar having a plurality of interdigitized electrode fingers extending therefrom, the widths of at least some fingers being different and selected as a function of the impedance of a cooperating load or source to produce mechanical electrical loaded reflected acoustic waves in the substrate for substantially canceling regenerated acoustic waves generated at the transducer, the interdigitized electrode fingers further having a tapered finger alignment wherein a periodicity of electrode fingers changes along a direction generally orthogonal to an acoustic wave axis of propagation through the transducer; and means for applying an electrical load or source across the bus bars.

2. The transducer as recited in claim 1, wherein at least one bus bar has at least two adjacent electrode fingers of different width extending therefrom within each acoustic wavelength along the propagation axis.

3. The transducer as recited in claim 1, wherein the tapered fingers are generally aligned along radially extending line segments emanating from a common focal point for forming linearly tapered electrodes.

4. The transducer as recited in claim 1, wherein the tapered fingers are generally aligned along hyperbolic line segments for forming hyperbolically tapered electrodes.

5. The transducer as recited in claim 1, wherein the tapered electrode fingers for at least one bus bar comprise finger pairs with each finger pair having a finger of narrow width and an adjacent finger of increased width, the finger widths dimensioned as fractional portions of its respective acoustic wavelength for a device having the transducer.

6. The transducer as recited in claim 1, wherein spacing of the electrode fingers along the axis of propagation provides four fingers within a spacing having a length dimension equal to its respective acoustic wavelength for a device having the transducer.

7. The transducer as recited in claim 6, wherein first and third fingers have a width of $\frac{1}{16}$ an acoustic wavelength and second and fourth fingers have a width of $\frac{3}{16}$ the wavelength, and adjacent fingers are separated by a gap of $\frac{1}{8}$ the wavelength.

8. The transducer as recited in claim 6, further comprising subtransducers, each subtransducer having fingers interdigitized with opposing subtransducer bus bars wherein a number of taps in each subtransducer varies, the subtransducers electrically connected for providing series-block weighting of the tapered transducer.

9. The transducer as recited in claim 1, further comprising subtransducers, each subtransducer having fingers interdigitized with opposing subtransducer bus bars wherein a number of taps in each subtransducer varies, the subtransducers electrically connected for providing series-block weighting of the tapered transducer.

10. The transducer as recited in claim 9, further comprising a centralized set of transducer interdigitized fingers and a plurality of subtransducers on each side of the transducer finger set.

11. The transducer as recited in claim 9, further comprising subtransducers symmetrically positioned on each side of an interdigitized transducer finger set.

12. The transducer as recited in claim 1, wherein three electrode fingers are distributed over a spacing of an acoustic wavelength.

13. The transducer as recited in claim 12, further comprising subtransducers, each subtransducer having fingers interdigitized with opposing subtransducer bus bars wherein a number of taps in each subtransducer varies, the subtransducers electrically connected for providing series-block weighting of the tapered transducer.

14. The transducer as recited in claim 1, further comprising three fingers per acoustic wavelength, wherein positions and widths of each finger are selected for independently providing desired reflection and transduction strengths for each tap within the transducer.

15. The transducer as recited in claim 14, further comprising subtransducers, each subtransducer having fingers interdigitized with opposing subtransducer bus bars wherein a number of taps in each subtransducer varies, the subtransducers electrically connected for providing series-block weighting of the tapered transducer.

16. A surface acoustic wave filter device operable over a wide band of frequencies and adapted for coupling to a source or load, the device comprising:

an acoustic wave propagating substrate having a surface acoustic wave axis of propagation;

a surface acoustic wave transducer having a pair of opposing bus bars formed on a substrate, each bus bar having a plurality of interdigitized electrode fingers extending therefrom, the widths of at least some fingers being different and selected as a function of the impedance of a cooperating load or source to produce mechanical electrical loaded reflected acoustic waves in the substrate for substantially canceling regenerated acoustic waves generated at the transducer, the interdigitized electrode fingers further having a tapered finger alignment wherein a periodicity of electrode fingers changes along a direction generally orthogonal to the propagation axis; and means for applying an electrical load or source across the bus bars.

17. The device as recited in claim 16, wherein a rate of taper is selected for controlling a pass band shape and causing the SAW device to operate to within a desired frequency range.

18. The device as recited in claim 16, wherein the tapered electrode fingers for at least one bus bar comprise finger pairs with each finger pair having a finger of narrow width and an adjacent finger of increased width, the finger widths dimensioned as fractional portions of a center frequency acoustic wavelength for the device.

19. The transducer as recited in claim 16, wherein spacing of the electrode fingers along the axis of propagation provides four fingers within a spacing having a length dimension equal to its respective acoustic wavelength for a device having the transducer.

20. The transducer as recited in claim 16, further comprising subtransducers, each subtransducer having fingers interdigitized with opposing subtransducer bus bars wherein a number of taps in each subtransducer varies, the subtransducers electrically connected for providing series-block weighting of the tapered transducer.

21. The device as recited in claim 16, wherein the transducer further comprising three electrode fingers per acoustic wavelength, wherein finger positions and finger widths are selected for independently providing desired reflection and transduction strengths for each tap within the transducer.

22. The transducer as recited in claim 21, further comprising subtransducers, each subtransducer having fingers interdigitized with opposing subtransducer bus bars wherein a number of taps in each subtransducer varies, the subtransducers electrically connected for providing series-block weighting of the tapered transducer.

23. A SPUDT SAW filter operable over a wide band of frequencies and adapted for coupling to a source or load, the filter comprising:

an acoustic wave propagating substrate having a surface acoustic wave axis of propagation;

input and output surface acoustic wave transducers, each transducer having a pair of opposing bus bars formed on a substrate, each bus bar having a plurality of interdigitized electrode fingers extending therefrom, the widths of at least some fingers being different and selected as a function of the impedance of a cooperating load or source respectively, to produce mechanical electrical loaded reflected acoustic waves in the substrate for substantially canceling regenerated acoustic waves generated at the transducer, the interdigitized electrode fingers further having a tapered finger alignment wherein a periodicity of electrode fingers changes along a direction generally orthogonal to the propagation axis;

means for applying an electrical load or source across the bus bars.

24. The transducer as recited in claim 23, wherein spacing of the electrode fingers along the axis of propagation provides four fingers within a length dimension equal to a center frequency acoustic wave wavelength for a device having the transducer.

25. The transducer as recited in claim 24, further comprising subtransducers, each subtransducer having fingers interdigitized with opposing subtransducer bus bars wherein a number of taps in each subtransducer varies, the subtransducers electrically connected for providing series-block weighting of the tapered transducer.

26. The transducer as recited in claim 23, further comprising three fingers per acoustic wavelength, wherein positions and widths of each finger are selected for independently providing desired reflection and transduction strengths for each tap within the transducer.

27. The transducer as recited in claim 23, further comprising subtransducers, each subtransducer having fingers interdigitized with opposing subtransducer bus bars wherein a number of taps in each subtransducer varies, the subtransducers electrically connected for providing series-block weighting of the tapered transducer.

28. The transducer as recited in claim 27, wherein positions and widths of each finger are selected for independently providing desired reflection and transduction strengths for each tap within the transducer.

* * * * *